United States Patent
Schulze et al.

(10) Patent No.: US 10,325,809 B2
(45) Date of Patent: Jun. 18, 2019

(54) METHODS FOR SPLITTING SEMICONDUCTOR DEVICES AND SEMICONDUCTOR DEVICE

(71) Applicant: Infineon Technologies AG, Neubiberg (DE)

(72) Inventors: Hans-Joachim Schulze, Taufkirchen (DE); Martin Faccinelli, Graz (AT); Johannes Georg Laven, Taufkirchen (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 15/710,481

(22) Filed: Sep. 20, 2017

(65) Prior Publication Data
US 2018/0082898 A1 Mar. 22, 2018

(30) Foreign Application Priority Data
Sep. 22, 2016 (DE) .................. 10 2016 117 921

(51) Int. Cl.
*H01L 21/78* (2006.01)
*H01L 21/762* (2006.01)
*H01L 21/304* (2006.01)

(52) U.S. Cl.
CPC ........ *H01L 21/7806* (2013.01); *H01L 21/304* (2013.01); *H01L 21/76254* (2013.01)

(58) Field of Classification Search
None
See application file for complete search history.

(56) References Cited

U.S. PATENT DOCUMENTS

| 5,374,564 | A | 12/1994 | Bruel |
| 7,618,875 | B2 * | 11/2009 | Kobayashi ............... B41M 5/24 |
| | | | 257/E21.525 |
| 2002/0093053 | A1 * | 7/2002 | Chan ................. H01L 21/76251 |
| | | | 257/347 |
| 2008/0057675 | A1 | 3/2008 | Henley et al. |
| 2011/0201176 | A1 | 8/2011 | Ramappa et al. |
| 2013/0029473 | A1 | 1/2013 | Kim et al. |
| 2014/0264374 | A1 | 9/2014 | Hecht et al. |

* cited by examiner

*Primary Examiner* — Long Pham
(74) *Attorney, Agent, or Firm* — Slater Matsil, LLP

(57) ABSTRACT

A method for splitting a semiconductor wafer includes incorporating hydrogen atoms into at least a splitting region of a semiconductor wafer. The splitting region includes a concentration of nitrogen atoms higher than $1 \cdot 10^{15}$ cm$^{-3}$. The method further includes splitting the semiconductor wafer at the splitting region of the semiconductor wafer.

20 Claims, 2 Drawing Sheets

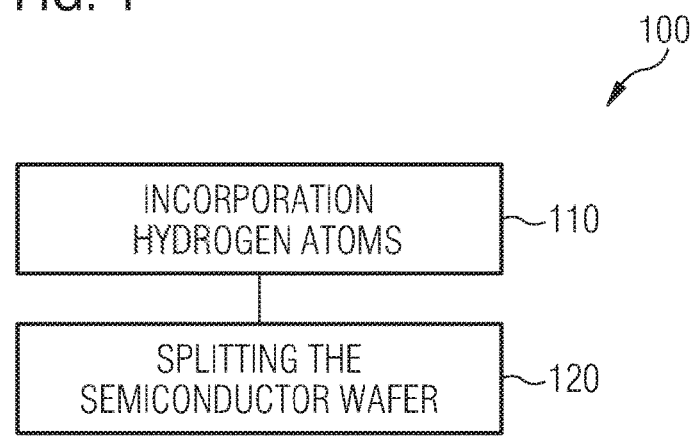
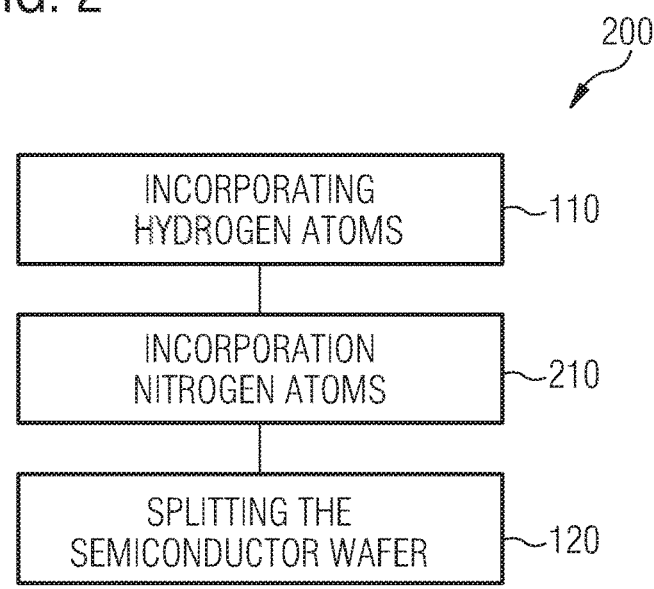

METHODS FOR SPLITTING SEMICONDUCTOR DEVICES AND SEMICONDUCTOR DEVICE

CROSS-REFERENCE TO RELATED APPLICATIONS

This application claims priority to German patent application No. 102016117921.3, filed on Sep. 22, 2016, which application is hereby incorporated herein by reference in its entirety.

TECHNICAL FIELD

Embodiments relate to concepts for manufacturing semiconductor devices and in particular to methods for splitting semiconductor devices and a semiconductor device.

BACKGROUND

During the manufacturing of semiconductor devices, it may be necessary to split a semiconductor wafer into two vertical portions, e.g. for the production of Silicon-On-Insulator (SOI) wafers. In some systems, a Smart Cut process may be used, which may be based on forming cavities within a region of the semiconductor wafer, which are then used to split the wafer vertically during a heating step. To form the cavities, in some systems, a very high dose of proton radiation may be required, which may lead to a high process complexity and high processing costs.

SUMMARY

There may be a demand to provide an improved concept for a splitting of semiconductor wafers, which enables a splitting of the semiconductor wafer at a reduced complexity and/or lower costs.

Such a demand may be satisfied by the subject matter of the claims.

Some embodiments relate to a method for splitting a semiconductor wafer. The method comprises incorporating hydrogen atoms into at least a splitting region of a semiconductor wafer. The splitting region comprises a concentration of nitrogen atoms higher than $1 \cdot 10^{15}$ cm$^{-3}$. The method further comprises splitting the semiconductor wafer at the splitting region of the semiconductor wafer.

Some embodiments relate to a method for splitting a semiconductor wafer. The method comprises incorporating hydrogen atoms into at least a splitting region of a semiconductor wafer. The method further comprises incorporating nitrogen atoms into at least the splitting region of the semiconductor wafer, so that the splitting region comprises a concentration of nitrogen atoms higher than $1 \cdot 10^{15}$ cm$^{-3}$ after incorporating the hydrogen atoms. The method further comprises splitting the semiconductor wafer at the splitting region of the semiconductor wafer.

Some embodiments relate to a semiconductor device comprising a semiconductor substrate comprising a concentration of nitrogen atoms higher than $1 \cdot 10^{15}$ cm$^{-3}$ at a distance of 1 µm from a surface of the semiconductor substrate.

BRIEF DESCRIPTION OF THE DRAWINGS

Some embodiments of apparatuses and/or methods will be described in the following by way of example only, and with reference to the accompanying figures, in which FIG. 1 shows a flow chart of a method for splitting a semiconductor wafer;

FIG. 2 shows a flow chart of a method for splitting a semiconductor wafer; and

DETAILED DESCRIPTION OF ILLUSTRATIVE EMBODIMENTS

Figure 3:
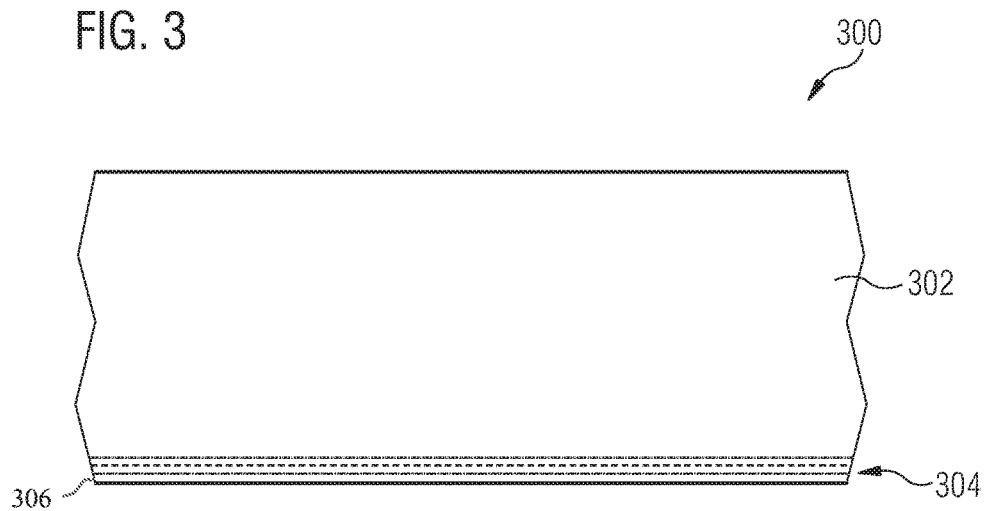
FIG. 3 shows a schematic cross section of a semiconductor device.

Various example embodiments will now be described more fully with reference to the accompanying drawings in which some example embodiments are illustrated. In the figures, the thicknesses of lines, layers and/or regions may be exaggerated for clarity.

Accordingly, while example embodiments are capable of various modifications and alternative forms, embodiments thereof are shown by way of example in the figures and will herein be described in detail. It should be understood, however, that there is no intent to limit example embodiments to the particular forms disclosed, but on the contrary, example embodiments are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art. However, should the present disclosure give a specific meaning to a term deviating from a meaning commonly understood by one of ordinary skill, this meaning is to be taken into account in the specific context this definition is given herein.

FIG. 1 illustrates a flow chart of a method 100 for splitting a semiconductor wafer. The method comprises incorporating 110 hydrogen atoms into at least a splitting region of a semiconductor wafer. The splitting region comprises a concentration of nitrogen atoms higher than $1 \cdot 10^{15}$ cm$^{-3}$ (or higher than $2 \cdot 10^{15}$ cm$^{-3}$, higher than $5 \cdot 10^{15}$ cm$^{-3}$, higher than $8 \cdot 10^{15}$ cm$^{-3}$, higher than $1 \cdot 10^{16}$ cm$^{-3}$). The method further comprises splitting 120 the semiconductor wafer at the splitting region of the semiconductor wafer. The semiconductor wafer may comprise a seed layer formed over a float zone or Czochralski substrate with an epitaxial semiconductor layer disposed on the seed layer. The seed layer may comprise the splitting region described herein.

The incorporation of the hydrogen atoms into the splitting region comprising a high nitrogen density may facilitate a creation of small cavities for a subsequent splitting of the semiconductor wafer. For example, the nitrogen atoms may reduce or prevent a diffusion of lattice vacancies so that a high vacancy density may be obtainable in the splitting region, although comparably few hydrogen atoms may be incorporated. In the absence of the nitrogen, the vacancies generated from the hydrogen incorporation diffuse out of the substrate and therefore prevented from agglomerating into vacancy clusters unless a larger amount of hydrogen is incorporated. In this way, the semiconductor wafer may be splitted at reduced complexity and/or low costs.

For example, the splitting region may correspond to a vertical region of the semiconductor wafer between an upper portion and a lower portion of the semiconductor wafer, at which the upper portion and the lower portion of the semiconductor wafer are separated during the splitting 120. For example, the splitting region may laterally extend over more than 90% (or more than 95%, more than 98%) of the semiconductor wafer, e.g. over substantially the whole semiconductor wafer so that the splitting results in splitting the semiconductor wafer into two separate substrates—a thin substrate layer and the underlying remaining semiconductor wafer. In a semiconductor device formed using this process, all active devices are formed in the thin substrate layer either before or after the splitting. The remaining semiconductor wafer may be used again to form another thin substrate layer. The thin substrate layer may be the epitaxial semiconductor layer formed over the float zone or Czochralski substrate and may include a portion of the seed layer with the splitting region.

For example, the splitting region may be located at a depth of between 100 μm and 200 μm (or between 120 μm and 180 μm, between 130 μm and 170 μm) from a (front-side) surface of the semiconductor wafer. For example, a (minimal or average) distance of the splitting region from a surface of the semiconductor wafer may be larger than 50 μm (or larger than 60 μm, larger than 80 μm, larger than 100 μm, larger than 150 μm, larger than 200 μm) and/or a (maximal or average) distance of the splitting region from a surface of the semiconductor wafer may be smaller than 500 μm (or smaller than 400 μm, smaller than 350 μm, smaller than 300 μm, smaller than 250 μm, smaller than 200 μm, smaller than 150 μm, smaller than 130 μm, smaller than 80 μm). For example, the distance may be measured vertically between the splitting region and a front-side surface of the semiconductor wafer (or a backside surface of the semiconductor wafer). For example, a depth at which the hydrogen atoms and/or the nitrogen atoms are incorporated (implanted) may be less than 3 μm (or less than 1 μm, less than 500 nm) from a surface through which the hydrogen atoms or hydrogen atoms are incorporated. For example, the semiconductor wafer may be thickened (a thickness of the semiconductor wafer may be increased by epitaxial growth of semiconductor material) after nitrogen/hydrogen implantation through epitaxial deposition.

For example, the splitting region may comprise a (average) thickness larger than 10 nm (or larger than 20 nm, larger than 30 nm, larger than 40 nm, larger than 50 nm, larger than 80 nm, larger than 100 nm, larger than 200 nm). The splitting region may comprise a (average) thickness smaller than 500 nm (or smaller than 400 nm, smaller than 300 nm, smaller than 200 nm, smaller than 100 nm, smaller than 50 nm).

For example, at least a part of a portion of semiconductor material of the semiconductor wafer extending from a surface of the semiconductor material of the semiconductor wafer to the splitting region may be epitaxially grown semiconductor material. For example, at least 70% (or at least 80%, at least 90%) of the portion of the semiconductor material of the semiconductor wafer extending from the surface of the semiconductor material of the semiconductor wafer to the splitting region may be epitaxially grown semiconductor material. For example, at least one of the hydrogen atoms and the nitrogen atoms may be incorporated (e.g. by an implantation with hydrogen ions or nitrogen ions) before at least a part of an epitaxial deposition of the semiconductor material (on the semiconductor wafer/semiconductor substrate). Preferably, the implantations required for the splitting process may be performed prior to the epitaxial deposition of semiconductor material on a semiconductor substrate so that the vertical extension of the splitting region (zone) might not be too large. For example, the surface of the semiconductor wafer, from which the epitaxially grown semiconductor material extends to at least the splitting region, may be a front-side surface of the semiconductor wafer or a surface of the semiconductor wafer, to which a carrier wafer is bonded during splitting 120.

For example, the incorporating 110 of the hydrogen atoms may comprise implanting the hydrogen atoms (by implanting of hydrogen ions) into at least the splitting region with an (average) implantation dose lower than $1 \cdot 10^{16}$ cm$^{-2}$ (or lower than $8 \cdot 10^{15}$ cm$^{-2}$, lower than $5 \cdot 10^{15}$ cm$^{-2}$, lower than $2 \cdot 10^{15}$ cm$^{-2}$). For example, the incorporating 110 of the hydrogen atoms may comprise implanting the hydrogen atoms into at least the splitting region with an (average) implantation dose higher than $1 \cdot 10^{15}$ cm$^{-2}$ (or higher than $2 \cdot 10^{15}$ cm$^{-2}$, higher than $5 \cdot 10^{15}$ cm$^{-2}$).

Additionally or alternatively, the hydrogen atoms may be incorporated by diffusing the hydrogen atoms (e.g. hydrogen atoms implanted previously) into at least the splitting region. The diffusing of the hydrogen atoms may be performed at a temperature of less than 450° C. (or less than 400° C., less than 350° C., less than 300° C.) and/or of more than 200° C. (or more than 250° C., more than 300° C.).

Alternatively, the hydrogen atoms may be incorporated by a hydrogen plasma treatment of the semiconductor wafer. For example, the hydrogen plasma treatment may be performed at a temperature of less than 450° C. (or less than 400° C., less than 350° C., less than 300° C.) and/or of more than 200° C. (or more than 250° C., more than 300° C.).

For example, a (average) concentration of the hydrogen atoms within the splitting region may be larger than $1 \cdot 10^{18}$ cm$^{-3}$ (or larger than $2 \cdot 10^{18}$ cm$^{-3}$, larger than $5 \cdot 10^{18}$ cm$^{-3}$, larger than $8 \cdot 10^{18}$ cm$^{-3}$) after the incorporation of the hydrogen atoms, which may be sufficiently high to enable a splitting of the semiconductor wafer.

For example, the method 100 may further comprise incorporating (e.g. by implanting, diffusing or incorporating during the growth of the semiconductor material) of nitrogen atoms into the splitting region of the semiconductor wafer so that the splitting region comprises a concentration of nitrogen atoms higher than $1 \cdot 10^{15}$ cm$^{-3}$ (or higher than $2 \cdot 10^{15}$ cm$^{-3}$, higher than $5 \cdot 10^{15}$ cm$^{-3}$, higher than $8 \cdot 10^{15}$ cm$^{-3}$, higher than $1 \cdot 10^{16}$ cm$^{-3}$), before the incorporating 110 of the hydrogen atoms. The incorporating of the nitrogen atoms may enable splitting of the semiconductor wafer at a reduced implantation dose of hydrogen atoms.

For example, at least one of the hydrogen atoms and the nitrogen atoms may be incorporated by an implantation with hydrogen ions or nitrogen ions with a maximum of a vertical distribution of the implanted hydrogen atoms or the implanted nitrogen atoms after the implantation located in the splitting region. The implantation may achieve the respective target concentration of hydrogen atoms and nitrogen atoms. Implanting the nitrogen atoms and/or the hydrogen atoms may provide the lattice vacancies required for the creation of cavities caused by a subsequent tempering of the semiconductor wafer.

For example, the incorporating of the nitrogen atoms may comprise implanting the nitrogen atoms into at least the splitting region (by implanting of nitrogen ions). Implanting the nitrogen atoms (ions) may enable a higher concentration of nitrogen atoms within the splitting region and may form lattice vacancies within the splitting region. The nitrogen atoms may be implanted with an implantation dose larger than $1·10^{14}$ cm$^{-2}$ (or larger than $2·10^{14}$ cm$^{-2}$, larger than $5·10^{14}$ cm$^{-2}$, larger than $1·10^{15}$ cm$^{-2}$). The nitrogen atoms may be implanted with an implantation dose lower than $1·10^{16}$ cm$^{-2}$ (or lower than $5·10^{15}$ cm$^{-2}$, lower than $1·10^{15}$ cm$^{-2}$, lower than $8·10^{14}$ cm$^{-2}$).

Alternatively, the nitrogen atoms may be incorporated during epitaxial growth of at least the splitting region of the semiconductor wafer. For example, the source gas for the epitaxial growth may comprise nitrogen-based impurities during the epitaxial growth of at least the splitting region. Alternatively or additionally, the nitrogen atoms may be incorporated by diffusing the nitrogen atoms into at least the splitting region (in-diffusion). For example, the diffusing of the nitrogen atoms into at least the splitting region may comprise heating the semiconductor wafer to more than 900° C. (or more than 1000° C., more than 1100° C.) for at least 1 hour (or at least 3 hours, at least 5 hours). Alternatively, the diffusing of the nitrogen atoms into at least the splitting region may be implemented during growth of a semiconductor crystal rod. A plurality of semiconductor wafers may be obtained from the crystal rod. For example, a concentration of nitrogen atoms within the splitting region may be between $2·10^{15}$ cm$^{-3}$ and $9·10^{15}$ cm$^{-3}$ or between $4·10^{15}$ cm$^{-3}$ and $8·10^{15}$ cm$^{-3}$ after diffusing of the nitrogen atoms, depending on a semiconductor material used for the semiconductor wafer.

If, for example, the nitrogen atoms are incorporated during epitaxial growth or through diffusion, the method may further comprise implanting at least one of helium (chem. symbol He), silicon (Si) argon (Ar), nitrogen (N) or hydrogen (H) ions into at least the splitting region, e.g. to obtain lattice vacancies required for the creation of cavities.

For example, a temperature of the semiconductor wafer after creating of lattice vacancies within the splitting region and before the incorporating of the hydrogen atoms may be lower than 300° C. (or lower than 250° C., lower than 150° C.). For example, the temperature of the semiconductor wafer may be lower than 300° C. (or lower than 250° C., lower than 150° C.) over the whole time between the creating of the lattice vacancies within the splitting region and the incorporating of the hydrogen atoms. Higher temperatures may lead to an annealing (recovery) or a diffusion of lattice vacancies.

For example, a (average) concentration of lattice vacancies within the splitting region may be at least 1050 (or at least 200%, at least 500%, at least 2000%, at least 10000%, at least $10^5$%, at least $10^6$%, at least $10^7$%) larger than an average concentration of lattice vacancies over the whole semiconductor wafer outside the splitting region.

For example, a (minimal or average) lattice vacancy density (concentration) within the splitting region after incorporation of the hydrogen atoms (and/or after incorporation of the nitrogen atoms) may be larger than $1·10^{17}$ cm$^{-3}$ (or larger than $5·10^{17}$ cm$^{-3}$, larger than $1·10^{18}$ cm$^{-3}$, larger than $2·10^{18}$ cm$^{-3}$, larger than $5·10^{18}$ cm$^{-3}$) within the splitting region. Higher lattice vacancy densities may enable a creation of a sufficient number of stable small cavities within the splitting region. For example, more than 80% (or more than 85%, more than 90%, more than 95%) of all lattice vacancies within the splitting region may be caused by incorporating the nitrogen atoms or the hydrogen atoms. A high concentration of nitrogen atoms may reduce a concentration of lattice vacancies that is required to from clusters of lattice vacancies, as the diffusing of lattice vacancies may be avoided or reduced by a forming of nitrogen-lattice vacancy-complexes.

For example, the method may further comprise bonding of the semiconductor wafer to a carrier wafer before the splitting of the semiconductor wafer. For example, a front-side surface of the semiconductor wafer may be bonded to the carrier wafer. Alternatively, a backside surface of the semiconductor wafer may be bonded to the carrier wafer. For example, the carrier wafer may comprise the same material or a different material as the semiconductor wafer. For example, a temperature coefficient of the carrier wafer may differ by less than 20% (or less than 15%, less than 10%, less than 5%) from a temperature coefficient of the semiconductor wafer.

For example, the splitting 120 of the semiconductor wafer may split the semiconductor wafer along the splitting region into a first vertical portion extending from a front side surface (before splitting) of the semiconductor wafer to the splitting region and a second vertical portion extending from a back-side surface (before splitting) of the semiconductor wafer to the splitting region.

For example, the semiconductor wafer may be split at least by heating the semiconductor wafer to a temperature higher than 700° C. (or higher than 800° C., higher than 900° C., higher than 1000° C., higher than 1100° C.), e.g. so that the semiconductor material of the semiconductor wafer breaks apart due to bubbles growing together within the implant zone and due to a formation of crack-supporting SiH$_x$-complexes within those bubbles (for x=1, 2 or higher). For example, the semiconductor wafer may be heated to a temperature lower than 1300° C. during splitting.

For example, the splitting 120 of the semiconductor wafer may comprise forming of cavities within the splitting region, e.g. during the heating of the semiconductor wafer. The cavities may enable the splitting of the semiconductor wafer. For example, the forming of the cavities may be based on a forming of lattice vacancy clusters from released lattice vacancies. For example, the splitting of the semiconductor wafer may comprise forming of silicon hydrogen complexes (SiH-complexes) at walls of the cavities within the splitting region, which may accelerate the splitting.

Additionally, external forces may be applied to the semiconductor wafer and/or a carrier wafer so that the semiconductor wafer breaks apart along the splitting region, since the crystal bonds in the splitting region may be weakened by the cavities.

For example, the method 100 may further comprise grinding and/or polishing of thin layer of the semiconductor wafer formed after splitting 120 of the semiconductor wafer. The method 100 may optionally further comprise forming a backside metallization, a backside emitter and/or a field stop zone over or within the thin layer of the semiconductor wafer, e.g. after grinding or polishing.

The method may further comprise forming a doping region of an electrical element structure before splitting 120 (e.g. at a front side surface of the semiconductor wafer). For example, the electrical element structure may comprise a breakdown voltage of more than 10V, e.g. more than 100V, more than 1000V, for example. For example, the electrical element structure may be vertical electrical element structure, e.g. an electrical structure enabling a vertical current flow through the semiconductor wafer in a conductive state or on-state of the vertical electrical element structure. For example, the electrical element structure may be an electrical element structure of a power semiconductor device. The vertical electrical element structure may be a vertical diode structure or a vertical transistor structure (e.g. a metal-oxide-semiconductor field effect transistor or insulated-gate-bipolar transistor).

For example, the semiconductor wafer may comprise a plurality of semiconductor devices, or may be used for a forming of a plurality of semiconductor devices, e.g. semiconductor devices as introduced in connection with FIG. 3.

The semiconductor wafer may be a silicon wafer, for example. Alternatively, the semiconductor wafer may be a wide band gap semiconductor wafer having a band gap larger than the band gap of silicon (1.1 eV). For example, the semiconductor wafer may be a silicon carbide (SiC)-based semiconductor wafer, or gallium arsenide (GaAs)-based semiconductor wafer, or a gallium nitride (GaN)-based semiconductor wafer.

For example, the vertical direction and a vertical dimension or thicknesses of layers may be measured orthogonal to a front side surface of the semiconductor wafer and a lateral direction and lateral dimensions may be measured in parallel to the front side surface of the semiconductor wafer.

The front side (or front side surface) of the semiconductor wafer may be the side (or surface) used to implement more sophisticated and complex structures than at the back side of the semiconductor wafer, since the process parameters (e.g. temperature) and the handling may be limited for the back side, if structures are already formed at one side of the semiconductor wafer, for example.

FIG. 2 shows a flow chart of a method 200 for splitting a semiconductor wafer. The method may be implemented similar to one or more examples described in connection with FIG. 1. The method 200 comprises incorporating 110 hydrogen atoms into at least a splitting region of a semiconductor wafer. The method further comprises incorporating 210 nitrogen atoms into at least the splitting region of the semiconductor wafer, so that the splitting region comprises a concentration of nitrogen atoms higher than $1 \cdot 10^{15}$ cm$^{-3}$ (or higher than $2 \cdot 10^{15}$ cm$^{-3}$, higher than $5 \cdot 10^{15}$ cm$^{-3}$, higher than $8 \cdot 10^{15}$ cm$^{-3}$, higher than $1 \cdot 10^{16}$ cm$^{-3}$) after incorporating the hydrogen atoms. The method further comprises splitting 120 the semiconductor wafer at the splitting region of the semiconductor wafer.

The method may facilitate a creation of small cavities for a subsequent splitting of the semiconductor wafer. For example, the nitrogen atoms may reduce a diffusion of lattice vacancies so that a high vacancy density may be obtainable in the splitting region, although comparably few hydrogen atoms may be incorporated. In this way, the semiconductor wafer may be splitted at reduced complexity and/or low costs.

For example, at least one of the hydrogen atoms and the nitrogen atoms may be incorporated by an implantation with hydrogen ions or nitrogen ions with a maximum of a vertical distribution of the implanted hydrogen atoms or the implanted nitrogen atoms after the implantation located in the splitting region. The implantation may achieve the respective target concentration of hydrogen atoms and nitrogen atoms. Implanting the nitrogen atoms may provide the lattice vacancies required for the creation of cavities caused by incorporating of the hydrogen atoms and a subsequent tempering of the semiconductor wafer.

For example, the nitrogen atoms may be incorporated during epitaxial growth or through diffusion. In this case, for example, the method may further comprise implanting at least one of helium (chem. symbol He), silicon (Si) and argon (Ar) (or nitrogen (N) or hydrogen (H)) ions into at least the splitting region, e.g. to obtain lattice vacancies required for the creation of small cavities. For example, the method 200 may comprise at least one implantation of atoms (by implantation of the respective ions) within the splitting region, to obtain the lattice vacancies within the splitting region.

More details and aspects of the method 200 are mentioned in connection with the proposed concept or one or more examples described above or below. The method may comprise one or more additional optional features corresponding to one or more aspects of the proposed concept or one or more examples described above (e.g. FIG. 1) or below (e.g. FIG. 3).

FIG. 3 illustrates a schematic cross section of a semiconductor device 300 formed after the splitting. The semiconductor device comprises a semiconductor substrate 302 comprising a concentration of nitrogen atoms higher than $1 \cdot 10^{15}$ cm$^{-3}$ (or higher than $2 \cdot 10^{15}$ cm$^{-3}$, higher than $5 \cdot 10^{15}$ cm$^{-3}$, higher than $8 \cdot 10^{15}$ cm$^{-3}$, higher than $1 \cdot 10^{16}$ cm$^{-3}$) at a distance of at least 1 µm (or at least 3 µm, at least 5 µm) from a surface of the semiconductor substrate. The semiconductor substrate 302 may be an epitaxial layer formed over a seed layer that comprises the splitting layer 304.

The concentration of hydrogen within the semiconductor substrate may stem from a splitting of a semiconductor wafer during a forming of the semiconductor device. The incorporation of nitrogen atoms into a splitting region may facilitate a creation of small cavities for a subsequent splitting of the semiconductor wafer. For example, the nitrogen atoms may reduce a diffusion of lattice vacancies so that a high vacancy density may be obtainable in the splitting region, although comparably few hydrogen atoms may be incorporated. In this way, the semiconductor wafer may be splitted at reduced complexity and/or low costs.

The semiconductor substrate (e.g. a semiconductor die) may be portion of a semiconductor wafer used during the forming of the semiconductor device, e.g., a semiconductor wafer as described in connection with one of the FIG. 1 or 2.

For example, the surface of the semiconductor substrate at the distance of 1 µm from a portion of the semiconductor substrate comprising a concentration of nitrogen atoms higher than $1 \cdot 10^{15}$ cm$^{-3}$ (or higher than $2 \cdot 10^{15}$ cm$^{-3}$, higher than $5 \cdot 10^{15}$ cm$^{-3}$, higher than $8 \cdot 10^{15}$ cm$^{-3}$, higher than $1 \cdot 10^{16}$ cm$^{-3}$) may correspond to a backside surface (or front side surface) of the semiconductor substrate or a backside (or front side) of the semiconductor device. For example, the semiconductor device may further comprise a backside metallization layer 306 located (directly) adjacent to the backside surface of the semiconductor substrate.

Alternatively, the surface of the semiconductor substrate at the distance of (at least) 1 µm from a portion of the semiconductor substrate comprising a concentration of nitrogen atoms higher than $1 \cdot 10^{15}$ cm$^{-3}$ (or higher than $2 \cdot 10^{15}$ cm$^{-3}$, higher than $5 \cdot 10^{15}$ cm$^{-3}$, higher than $8 \cdot 10^{15}$ cm$^{-3}$, higher than $1 \cdot 10^{16}$ cm$^{-3}$) may correspond to a front side surface of the semiconductor substrate For example, the concentration of nitrogen atoms may be higher than $1 \cdot 10^{15}$ cm$^{-3}$ (or higher than $2 \cdot 10^{15}$ cm$^{-3}$, higher than $5 \cdot 10^{15}$ cm$^{-3}$, higher than $8 \cdot 10^{15}$ cm$^{-3}$, higher than $1 \cdot 10^{16}$ cm$^{-3}$) at the distance of (at least) 1 µm from the surface of the semiconductor substrate over at least 90% (or at least 95%, at least 98%) of a lateral extension of the semiconductor substrate.

For example, a thickness of the semiconductor substrate may be larger than 50 µm (or larger than 60 µm, larger than 80 µm, larger than 100 µm, larger than 150 µm, larger than 200 µm). The thickness of the semiconductor substrate may be smaller than 500 µm (or smaller than 400 µm, smaller than 350 µm, smaller than 300 µm, smaller than 250 µm, smaller than 200 µm, smaller than 150 µm).

The semiconductor substrate of the semiconductor device 300 may be a silicon substrate. Alternatively, the semiconductor substrate may be a wide band gap semiconductor substrate having a band gap larger than the band gap of silicon (1.1 eV). For example, the semiconductor substrate may be a silicon carbide (SiC)-based semiconductor substrate, or gallium arsenide (GaAs)-based semiconductor substrate, or a gallium nitride (GaN)-based semiconductor substrate. The semiconductor substrate may be a semiconductor wafer (e.g. the semiconductor wafer described in connection with FIG. 1 or 2) or a semiconductor die.

For example, the semiconductor device 300 may comprise a (vertical) electrical element arrangement. For example, the vertical electrical element arrangement of the semiconductor device and/or the whole semiconductor device may comprise a breakdown voltage or blocking voltage of more than 10V, e.g. more than 20V, more than 50V, for example. The semiconductor device 300 may be a power semiconductor device. A power semiconductor device and/or the vertical electrical element arrangement (e.g. transistor arrangement/structure or diode arrangement/structure) of the power semiconductor device may have a breakdown voltage or blocking voltage of more than 10V (e.g. a breakdown voltage of 10 V, 20 V or 50V), more than 100 V (e.g. a breakdown voltage of 200 V, 300 V, 400V or 500V) or more than 500 V (e.g. a breakdown voltage of 600 V, 700 V, 800V or 1000V) or more than 1000 V (e.g. a breakdown voltage of 1200 V, 1500 V, 1700V, 2000V, 3300V or 6500V), for example.

More details and aspects of the semiconductor device 300 are mentioned in connection with the proposed concept or one or more examples described above or below. The semiconductor device 300 may comprise one or more additional optional features corresponding to one or more aspects of the proposed concept or one or more examples described above (e.g. FIG. 1 or 2) or below.

Embodiments may enable a "Smart Cut" process for splitting semiconductor wafers having/resulting in a decreased processing effort and a reduced cost.

In other Smart Cut systems, a high-dose proton radiation may be applied, which leads, after a suitable subsequent tempering, to bubbles within the silicon and (e.g., after wafer bonding of the implanted wafer on a carrier wafer) to a splitting of the portions of the wafer located above and below the region comprising the silicon bubbles. In other systems, very high proton radiation doses of multiple/several 1.E+16 per square cm may be required.

At least some embodiments may be based on using nitrogen implantations to generate the (lattice) vacancies required for the Smart Cut process, as the implanted (incorporated) nitrogen atoms may provide both a high vacancy density due to their larger mass compared to hydrogen, and may prevent a significant diffusion of the vacancies from the implantation region during implantation and/or a recombination with interstitials (e.g. may prevent the vacancies from significantly diffusing away from the implantation region during implantation and/or a recombination with interstitials). This effect may be caused by a better ability of nitrogen atoms to bind vacancies and thus prevent their diffusion/and thus prevent them from diffusing.

During the subsequent tempering, the bound vacancies may be released and may form vacancy clusters, which may act as nucleation centers for "cavities". As this may increase the vacancy density (significantly), the Smart Cut process (using in-diffusion or implantation of hydrogen atoms) may be applied with (significantly) reduced hydrogen implantation doses. Above a critical vacancy density, stable cavities may be formed; the incorporated hydrogen may act as accelerator for splitting the semiconductor wafer through a development of silicon hydrogen-complexes (chem. symbol: SiH) at the inner cavity walls. The proton implantation, e.g., used in other systems may create relatively few vacancies and may require relatively high doses, until a sufficient size and density of the cavities is reached to enable the splitting process. Using proton implantation, defect cascades within the crystal grid may be less common (and/or of less intensity), which may lead to comparatively few higher-order vacancy reactions that may lead to stable cavities. The presence of nitrogen may compensate for said effect, so that the crystal damage caused by the hydrogen may be transformed more effectively into the higher-complexity defects relevant for the development of cavities.

This effect can, for example, be shown in experiments in which hydrogen atoms were implanted with a (comparatively) low dose in silicon wafers having significantly different nitrogen concentrations (e.g., an order of magnitude). It was shown that, at a higher nitrogen concentration/concentration of nitrogen, the development of vacancy complexes was (significantly) increased/stronger, which may enable applying the Smart Cut process with significantly reduced implantation doses (of hydrogen). In preliminary experiments, a factor-2 increase in an efficiency of development of vacancy complexes was shown.

The hydrogen atoms that, in combination with the cavities formed, may be required for the splitting process may, e.g., be incorporated using a hydrogen plasma treatment at temperatures between 250° C. and 400° C. or using an implantation of hydrogen atoms, which may be reordered through a subsequent tempering (e.g., in a temperature range between 250° C. and 400° C.). The minimum concentration of vacancies required for the splitting may, in case of the hydrogen in-diffusion, be (significantly) reduced compared to incorporation using proton implantation, due to the (significantly) higher hydrogen concentration achievable through in-diffusion.

Alternatively or additionally, the nitrogen atoms may be incorporated through (in-)diffusion or though incorporation during epitaxial deposition; in this case, the vacancies may need to be formed through an implantation process (e.g., hydrogen, or, if hydrogen is in-diffused, nitrogen, helium, silicon, argon or other ions). An in-diffusion may take place at processing temperatures above 1000° C. or 1200° C. at wafer level, or may alternatively be implemented before the (dedicated) Smart Cut processing directly into the crystal rod. For example, the crystal rod may be drawn from a melt comprising an increased nitrogen concentration, with which the nitrogen was mixed before/to which the nitrogen was added previously, e.g., through in-diffusion or through an addition of nitrates (e.g., nitrogen oxide ($NO_x$), nitric acid ($HNO_3$)).

At least some embodiments may enable a less complex Smart Cut process through incorporating a sufficient concentration of nitrogen atoms (preferably with a concentration above $2 \cdot 10^{15}$ cm$^{-3}$, especially above $5 \cdot 10^{15}$ cm$^{-3}$) and the forming of a sufficiently high vacancy concentration with a subsequent in-diffusion or implantation and in-diffusion of hydrogen atoms. At least some embodiments may be based on a combination of nitrogen implantation (preferably comprising a dose $>10^{14}$ and especially $>5 \cdot 10^{14}$ per square cm/cm$^2$) and an incorporation of hydrogen through implantation and/or in-diffusion.

Example embodiments may further provide a computer program having a program code for performing one of the above methods, when the computer program is executed on a computer or processor. A person of skill in the art would readily recognize that acts of various above-described methods may be performed by programmed computers. Herein, some example embodiments are also intended to cover program storage devices, e.g., digital data storage media, which are machine or computer readable and encode machine-executable or computer-executable programs of instructions, wherein the instructions perform some or all of the acts of the above-described methods. The program storage devices may be, e.g., digital memories, magnetic storage media such as magnetic disks and magnetic tapes, hard drives, or optically readable digital data storage media. Further example embodiments are also intended to cover computers programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

What is claimed is:

1. A method for splitting a semiconductor wafer, the method comprising:
    incorporating hydrogen atoms into a splitting region of a semiconductor wafer, wherein the splitting region comprises a concentration of nitrogen atoms higher than $1 \times 1015$ cm$-3$; and
    splitting the semiconductor wafer at the splitting region of the semiconductor wafer,
    wherein a part of a portion of the semiconductor wafer extending from a surface of the semiconductor wafer to the splitting region is epitaxially grown semiconductor material, and wherein the hydrogen atoms or the nitrogen atoms are incorporated before a part of an epitaxial deposition of the semiconductor material.

2. The method according to claim 1, further comprising incorporating nitrogen atoms into the splitting region of the semiconductor wafer so that the splitting region comprises a concentration of nitrogen atoms higher than $1 \times 1015$ cm$-3$.

3. The method according to claim 2, wherein the hydrogen atoms or the nitrogen atoms are incorporated by an implantation with hydrogen ions or nitrogen ions with a maximum of a vertical distribution of the implanted hydrogen atoms or the implanted nitrogen atoms after the implantation located in the splitting region.

4. The method according to claim 2, wherein the incorporating of the nitrogen atoms comprises implanting the nitrogen atoms into the splitting region, wherein the nitrogen atoms are implanted with an implantation dose larger than $1 \times 1014$ cm$-2$.

5. The method according to claim 2, wherein more than 80% of all lattice vacancies within the splitting region are caused by incorporating the nitrogen atoms or the hydrogen atoms.

6. The method according to claim 1, wherein the nitrogen atoms are incorporated during epitaxial growth of at least the splitting region of the semiconductor wafer.

7. The method according to claim 1, wherein the nitrogen atoms are incorporated by diffusing the nitrogen atoms into the splitting region.

8. The method according to claim 1, further comprising implanting helium, silicon, or argon ions into the splitting region.

9. The method according to claim 1, wherein the incorporating of the hydrogen atoms comprises implanting the hydrogen atoms into the splitting region with an implantation dose lower than $1 \times 1016$ cm$-2$.

10. The method according to claim 1, wherein the hydrogen atoms are incorporated by diffusing the hydrogen atoms into the splitting region or by a hydrogen plasma treatment of the semiconductor wafer.

11. The method according to claim 1, wherein a lattice vacancy density within the splitting region after the incorporation of the hydrogen atoms and the nitrogen atoms is larger than $1\times10^{17}$ cm$^{-3}$ within the splitting region.

12. The method according to claim 1, wherein a temperature of the semiconductor wafer after creating of lattice vacancies within the splitting region and before the incorporating of the hydrogen atoms is lower than 300° C.

13. The method according to claim 1, wherein a distance of the splitting region from a surface of the semiconductor wafer is larger than 50 μm.

14. The method according to claim 1, further comprising forming a doping region of an electrical element structure before the splitting.

15. The method according to claim 14, wherein the electrical element structure comprises a breakdown voltage of more than 10V.

16. The method according to claim 1, wherein the semiconductor wafer is split by heating the semiconductor wafer to a temperature higher than 700° C.

17. A method for splitting a semiconductor wafer, the method comprising:
   incorporating hydrogen atoms into a splitting region of a semiconductor wafer;
   incorporating nitrogen atoms into the splitting region of the semiconductor wafer, so that the splitting region comprises a concentration of nitrogen atoms higher than $1\times10^{15}$ cm$^{-3}$ wherein, after incorporating the hydrogen atoms and the nitrogen atoms, the semiconductor wafer comprises a device layer, the splitting region, and a substrate, the splitting region being disposed between the device layer and the substrate; and
   separating the device layer from the substrate by splitting the semiconductor wafer at the splitting region of the semiconductor wafer,
   wherein a part of a portion of the semiconductor wafer extending from a surface of the semiconductor wafer to the splitting region is epitaxially grown semiconductor material, and wherein the hydrogen atoms or the nitrogen atoms are incorporated before a part of an epitaxial deposition of the semiconductor material.

18. The method according to claim 17, further comprising:
   forming an active device in the device layer.

19. The method according to claim 17, wherein a portion of the splitting region is attached to the device layer, the method further comprising polishing a surface of the splitting region.

20. The method according to claim 17, further comprising:
   attaching a carrier substrate to the device layer before the separating.

* * * * *